United States Patent
Fujisawa

(10) Patent No.: US 7,668,039 B2
(45) Date of Patent: Feb. 23, 2010

(54) ADDRESS COUNTER, SEMICONDUCTOR MEMORY DEVICE HAVING THE SAME, AND DATA PROCESSING SYSTEM

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 34 days.

(21) Appl. No.: 12/167,719

(22) Filed: Jul. 3, 2008

(65) Prior Publication Data
US 2009/0010092 A1    Jan. 8, 2009

(30) Foreign Application Priority Data
Jul. 4, 2007    (JP) .............................. 2007-175843

(51) Int. Cl.
*G11C 8/00*    (2006.01)
(52) U.S. Cl. .................. 365/236; 365/219; 365/230.08; 365/233.11
(58) Field of Classification Search ................. 365/236, 365/233.1, 233.11, 230.08, 219
See application file for complete search history.

(56) References Cited

U.S. PATENT DOCUMENTS 5,999,458 A * 12/1999 Nishimura et al. ..... 365/189.05
6,856,270 B1 * 2/2005 Farmer et al. ............... 341/161
6,914,829 B2 * 7/2005 Lee ........................ 365/189.02
7,426,144 B2 * 9/2008 Fujisawa ................ 365/189.05
2008/0049541 A1 * 2/2008 Fujisawa ................ 365/233.18

FOREIGN PATENT DOCUMENTS

JP    2007-102936 A    4/2007

OTHER PUBLICATIONS

Song et al., "A 1.2Gb/s/pin Double Data Rate SDRAM with On-Die-Termination", ISSCC 2003/Session 17/SRAM and DRAM/Paper 17.8, (U.S.A.), IEEE, 2003, p. 314.

* cited by examiner

*Primary Examiner*—Tuan T Nguyen
*Assistant Examiner*—Hien N Nguyen
(74) *Attorney, Agent, or Firm*—Sughrue Mion, PLLC

(57) ABSTRACT

An address counter includes FIFO units and first and second command counters that control the groups. The first command counter has a first mode in which any one of input gates is conducted in response to a first internal command and a second mode in which a plurality of input gates are conducted in response to an internal command. The second command counter has a first mode in which any one of output gates is conducted in response to one of second and third internal commands and second mode in which corresponding output gates are each conducted in response to one of the second and third internal commands. Thereby, when tCCD is small, the first mode can be selected, and when the tCCD is large, the second mode can be selected.

11 Claims, 12 Drawing Sheets

ADDRESS COUNTER, SEMICONDUCTOR MEMORY DEVICE HAVING THE SAME, AND DATA PROCESSING SYSTEM

TECHNICAL FIELD

The present invention relates to an address counter and a semiconductor memory device having the same, and, more particularly relates to an address counter using a point-shift FIFO circuit and a semiconductor memory device having the same. The present invention also relates to a data processing system including such a semiconductor memory device.

BACKGROUND OF THE INVENTION

Synchronous memory devices represented by synchronous DRAM (Dynamic Random Access Memory) have been widely used for a main memory or the like of a personal computer. The synchronous memory device can input and output data in synchronism with a clock signal supplied from a memory controller. Therefore, when a higher-speed clock is used, a data transfer rate can be increased.

However, so long as a DRAM core performs an analog operation also in the synchronous DRAM, a considerably weak charge needs to be amplified based on a sense operation. Accordingly, it is not possible to shorten a time from issuing a read command until outputting first data. After a lapse of a predetermined delay time since an issuance of the read command, the first data is outputted in synchronism with an external clock.

This delay time during a read operation is generally called a "CAS latency" and is set to an integral multiple of a clock cycle. For example, when the CAS latency is 5 (CL=5), the synchronous memory device fetches the read command in synchronism with the external clock, and thereafter, outputs the first data in synchronism with the external clock after five clock cycles. That is, the first data is outputted after a lapse of the five clock cycles.

Such delay is required also during a write operation. During the write operation, the data needs to be continuously inputted in synchronism with the external clock after a lapse of a predetermined delay time after an issuance of a write command. This delay time during the write operation is generally called a "CAS write latency" and is set to an integral multiple of a clock cycle. For example, when the CAS write latency is 5 (CWL=5), the synchronous memory device fetches the write command in synchronism with the external clock, and thereafter, needs to input the first data in synchronism with the external clock after five clock cycles.

The write data thus fetched is written via a read/write bus, a column switch or the like into a memory cell employed inside the memory device. Thus, it is necessary that an address signal is appropriately delayed also inside the memory device to supply the address signal to each circuit at an appropriate timing. Because of these purposes, an FIFO circuit that delays the address signal by a predetermined period is used in the synchronous memory device. Such a FIFO circuit is generally called an "address counter".

The most simple method for delaying the address signal is to use a shift-register FIFO circuit. However, when this method is used, there is a problem in that since the number of required stages of shift registers is proportional to the latency. Therefore, when the latency becomes larger, a size of a circuit scale is automatically increased. Since the latency is tended to become larger with a higher frequency of a clock, it is not possible to avoid an increase of latency caused concurrently with a high speed of the synchronous memory device.

For an FIFO circuit smaller in circuit scale than that of the shift register type, there have been types of a point-shift FIFO circuit described in Japanese Patent Application Laid-open No. 2007-102936 and in "A 1.2 Gb/s/pin Double Data Rate SDRAM with On-Die-Termination", by Ho Young Song and 15 others, ISSCC 2003/SESSION 17/SRAM AND DRAM/ PAPER 17.8, (U.S.A), IEEE, 2003, p. 314. The point-shift FIFO circuit is an FIFO circuit which has a configuration in which a plurality of latch circuits having input gates and output gates are connected in parallel. The point-shift FIFO circuit can set an output timing of a latched signal by being brought any one of the input gates and any one of the output gates into on state.

The number of latch circuits required for the point-shift FIFO circuit is not equal to that of the latencies, but is defined according to a maximum accumulation number of an address signal to be delayed. Thus, the circuit scale can be further reduced than a case that the shift register is used.

As described above, in the synchronous memory device, timings for supplying addresses to the respective internal circuits differ. Thus, when the address counter is configured by using the point-shift FIFO circuit, it becomes necessary to prepare a plurality of sets of FIFO units inside the point-shift FIFO circuit.

More specifically, because write data inputted via a data input/output terminal is supplied from the data input/output circuit via the column switch or the like to the memory cell, supplying the address signal basically needs to be performed according to this order. Thus, it becomes necessary to separately prepare a FIFO unit that supply the address signal to the data input/output circuit and a FIFO unit that supply the address signal to the column switch.

In addition, as described above, the number of latch circuits required for one set of the FIFO unit is defined by a maximum accumulation number of address signal, and thus, when a minimum input cycle (tCCD) of a command is small, the circuit scale becomes large as a result, and this poses a problem.

SUMMARY OF THE INVENTION

The present invention has been achieved to solve the above problems, and an object of the present invention is to provide an improved address counter using a point-shift FIFO circuit.

Another object of the present invention is to provide an address counter using a point-shift FIFO circuit, the address counter capable of reducing a circuit scale.

Still another object of the present invention is to provide a semiconductor memory device having such an address counter.

Still another object of the present invention is to provide a data processing system having such a semiconductor memory device.

An address counter according to the present invention comprises:

a plurality of FIFO units each of which stores a corresponding bit of an address signal, each FIFO unit including a plurality of parallel connected latch circuits each having an input gate and an output gate;

a first command counter that brings any one of the input gates included in each FIFO unit into ON state in response to a first internal command during a first operation mode, and that brings two or more input gates included in each FIFO unit into ON state in response to the first internal command during a second operation mode; and a second command counter that brings any one of the output gates included in each FIFO unit into ON state in response to one of second and third internal commands during the first operation mode, and that brings any one of the output gates included in each FIFO unit into ON state in response to the second internal command and brings any one of the output gates included in each FIFO unit into ON state in response to the third internal command during the second operation mode.

A semiconductor memory device according to the present invention, comprises:

a memory cell array;

a data input/output terminal;

a first data selection circuit that supplies a first data bus with write data inputted via the data input/output terminal;

a second data selection circuit that supplies the memory cell array with the write data on the first data bus; and the address counter having above mentioned configuration, wherein the address signal that passes through the output gates is supplied to the first and second data selection circuits during the first operation mode, the address signal that passes through the output gates in response to the second internal command is supplied to the first data selection circuit during the second operation mode, and the address signal that passes through the output gates in response to the third internal command is supplied to the second data selection circuit during the second operation mode.

A data processing system according to the present invention includes the semiconductor memory device having above mentioned configuration.

It is preferable that the semiconductor memory device according to the present invention further comprises a mode register for setting a burst length, wherein the first data selection circuit includes:

a FIFO block connected to the data input/output terminal;

a transfer circuit that inputs and outputs in parallel k-bit data continuously inputted or continuously outputted via the data input/output terminal; and a second data bus that performs data transfer between the transfer circuit and the FIFO block, wherein when a minimum burst length settable to the mode register is represented by j (<k), the transfer circuit performs data transfer using the second data bus in a j-bit unit irrespective of the burst length.

It is more preferable that the memory cell array is divided into a plurality of groups, and the semiconductor memory device further comprises main amplifiers each of which outputs the k-bit data from a corresponding group of the memory cell array, and wherein the transfer circuit selects j-bit data for each group out of the k-bit data outputted from the main amplifiers and supplies the selected j-bit data via the second data bus to the FIFO block.

It is more preferable that when the burst length set to the mode register is k, the transfer circuit successively supplies via the second data bus to the FIFO block the k-bit data read from the memory cell array belonging to a same group by each j bits. On the other hand, when the burst length set to the mode register is j, the transfer circuit successively supplies via the second data bus to the FIFO block the j-bit data read from the memory cell array belonging to a different group.

Thus, the address counter according to the present invention has a configuration of the point-shift FIFO circuit, and has the first operation mode in which a plurality of FIFO units are collectively used and the second operation mode in which a plurality of FIFO units are divided and used. Accordingly, when tCCD is small, the first operation mode is selected, and when tCCD is large, the second operation mode is selected. Thereby, it becomes possible to reduce a circuit scale of the address counter.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
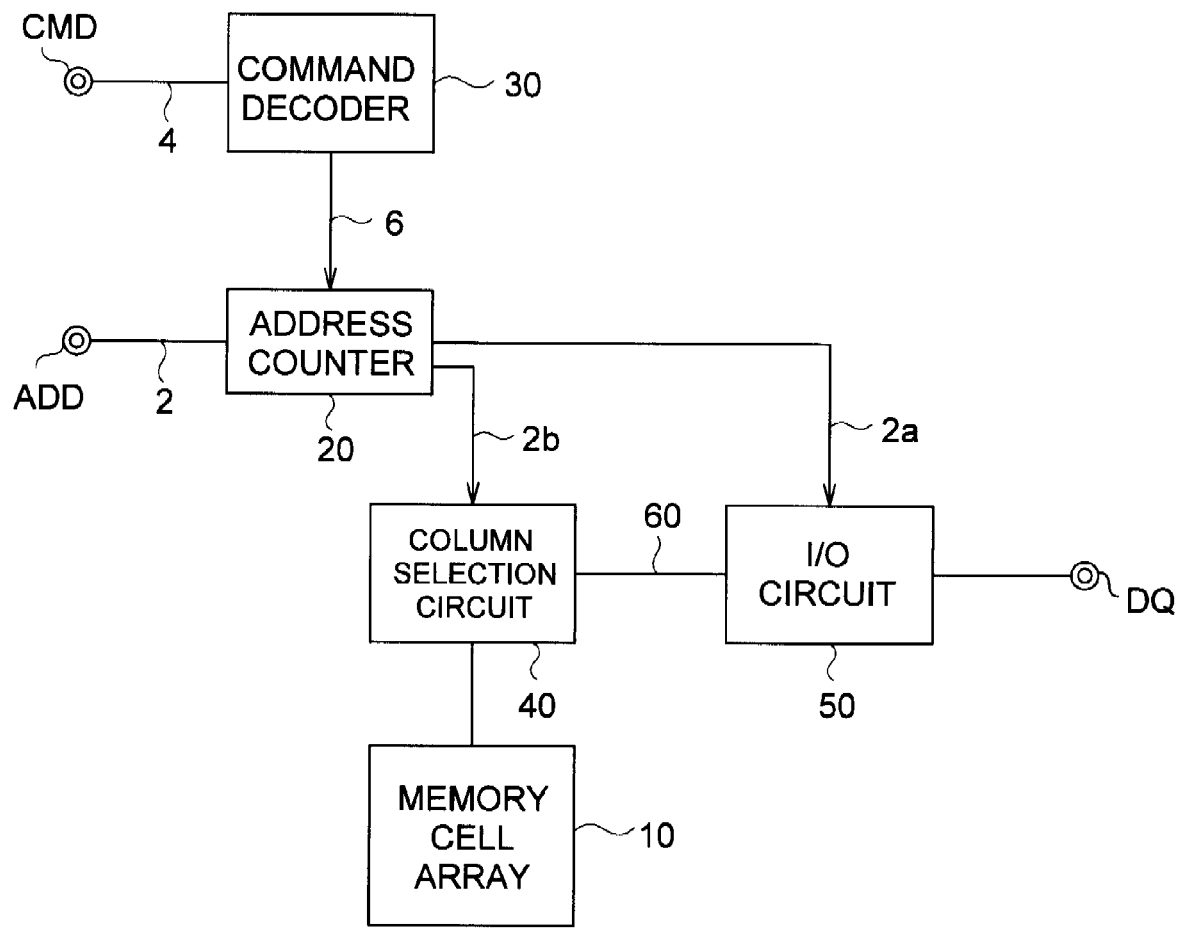
FIG. 1 is a block diagram showing a configuration of a main part of a semiconductor memory device according to a first embodiment of the present invention.

FIG. 1 is a block diagram showing a configuration of a main part of a semiconductor memory device according to the first embodiment of the present invention. In FIG. 1, only column system circuits and data system circuits are shown because they are characteristic parts of the semiconductor memory device of the present embodiment. A row system circuits or the like are therefore omitted.

As shown in FIG. 1, the semiconductor memory device includes: a memory cell array 10; and external terminals such as a data input/output terminal DQ, an address terminal ADD, and a command terminal CMD. In a case of performing a write operation, a write command is issued via the command terminal CMD, and a desired address signal is inputted via the address terminal ADD. After a lapse of a predetermined latency, write data is supplied to the data input/output terminal DQ.

An address signal (column address) 2 inputted via the address terminal ADD is fetched into an address counter 20, and a command signal 4 inputted via the command terminal CMD is decoded by a command decoder 30. An internal command 6 that is generated by the command decoder 30 is supplied to the address counter 20, and thereby, an operation of the address counter 20 is controlled. The address signal 2 fetched into the address counter 20 is supplied to a column selection circuit 40 and an I/O circuit 50 at a predetermined timing under the control of the command decoder 30.

The I/O circuit 50 is a circuit that supplies the write data inputted via the data input/output terminal DQ to a data bus 60. The I/O circuit 50 works as a "first data selection circuit" in the present invention. Although not shown, in the I/O circuit 50, besides an input buffer and an output buffer, a circuit that performs serial-to-parallel conversion of burst-inputted write data or the like is included.

Further, the column selection circuit 40 is a circuit that supplies the memory cell array 10 with the write data on the data bus 60. The column selection circuit 40 works as a "second data selection circuit" in the present invention. Although not shown, the column selection circuit 40 includes a column switch, a column decoder or the like.

Figure 2:
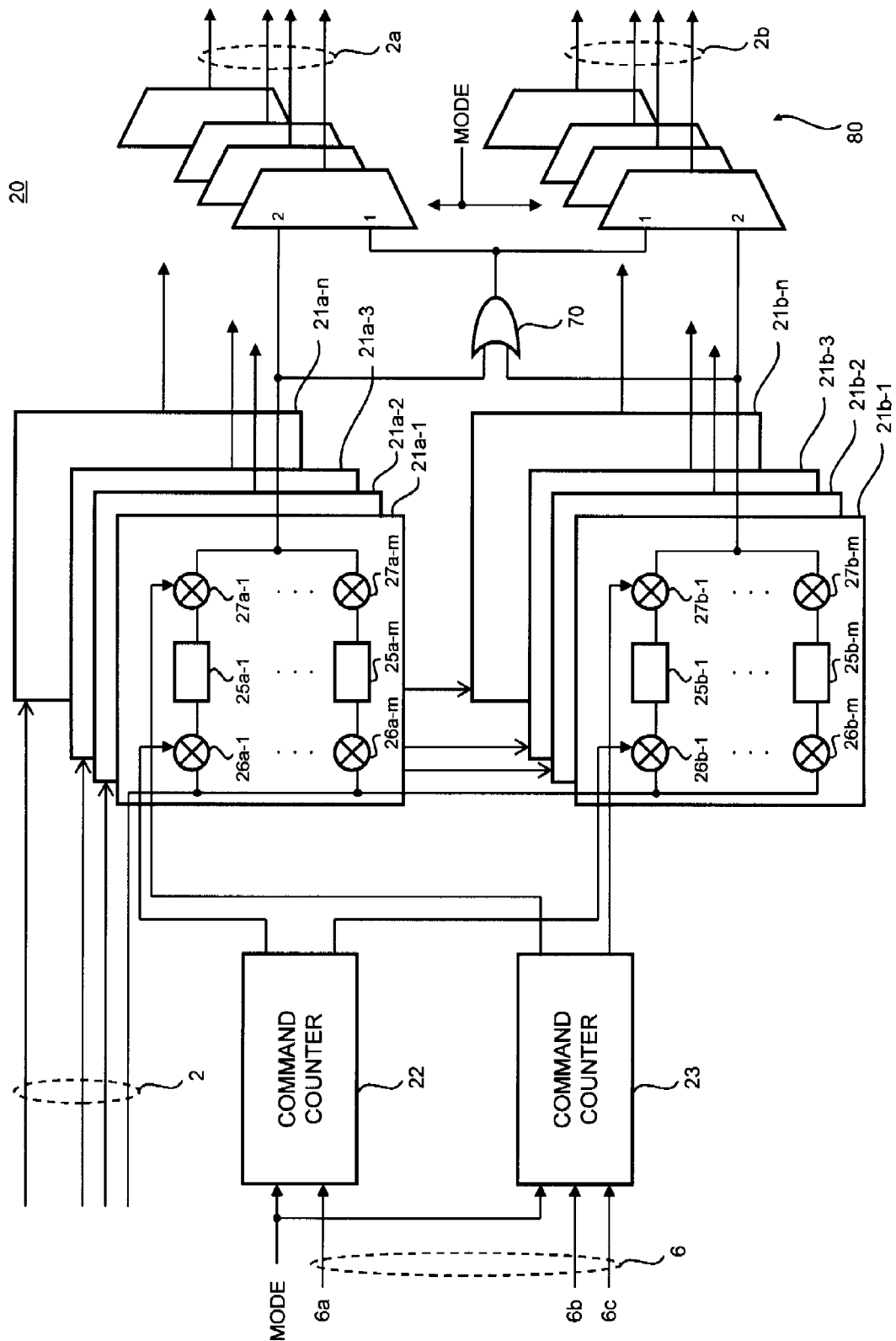
FIG. 2 is a circuit diagram of an address counter shown in FIG. 1.

FIG. 2 is a circuit diagram of the address counter 20.

As shown in FIG. 2, the address counter 20 has a configuration of the point-shift FIFO circuit, and includes: a plurality of FIFO units 21a-1 to 21a-n and 21b-1 to 21b-n; and command counters 22 and 23 that control these FIFO units 21a-1 to 21a-n and 21b-1 to 21b-n.

Each FIFO unit 21a-1 to 21a-n can hold a corresponding one bit of the address signal 2. Similarly, each FIFO unit 21b-1 to 21b-n can hold a corresponding one bit of the address signal 2. Accordingly, the number (=2n) of FIFO units is equal to two times the number of bits of the address signal 2 to be latched.

As shown in FIG. 2, each FIFO unit 21a-1 to 21a-n have a configuration in which a plurality of latch circuits 25a-1 to 25a-m are connected in parallel. The latch circuits 25a-1 to 25a-m are connected with input gates 26a-1 to 26a-m and output gates 27a-1 to 27a-m, respectively. Similarly, each FIFO unit 21b-1 to 21b-n have a configuration in which a plurality of latch circuits 25b-1 to 25b-m are connected in parallel. The latch circuits 25b-1 to 25b-m are connected with input gates 26b-1 to 26b-m and output gates 27b-1 to 27b-m, respectively. The number (=m) of latch circuits included in one FIFO unit is set according to a maximum accumulation number X of the address signal 2.

The maximum accumulation number X of the address signal 2 differs depending on an operation mode of the semiconductor memory device. In the first embodiment, in a case of being set to a first operation mode, the maximum accumulation number X=2m is established, and in a case of being set to a second operation mode, the maximum accumulation number X=m is established. Specifically, in a case of DDR (double data rate) synchronous DRAM, X is defined as X=1+{AL+CWL+(BL/2)+2}/tCCd, where AL denotes an additive latency; CWL denotes a CAS write latency; BL denotes a burst length; and tCCD denotes a minimum input cycle of a command. As one example, in the first operation mode, when AL=10; CWL=8; BL=4; and tCCD=2, X=12 is established. On the other hand, in the second operation mode, when AL=10; CWL=8; BL=8; and tCCD=4, X=6 is established. Accordingly, when the number (=n) of bits of the address signal 2 is 16 bits, for example, 192 (=12×16) latch circuits are needed.

The command counter 22 is a circuit that performs a count operation in response to an internal command 6a, and the command counter 23 is a circuit that performs a count operation in response to internal commands 6b and 6c.

The internal command 6a is an internal command generated in response to issuance of a read command or a write command. On the other hand, the internal commands 6b and 6c are internal commands generated with a predetermined latency to the internal command 6a. The latency of the internal command 6b is determined based on an address supply timing to the I/O circuit 50 shown in FIG. 1, and the latency of the internal command 6c is determined based on an address supply timing to the column selection circuit 40 shown in FIG. 1.

Figure 3:
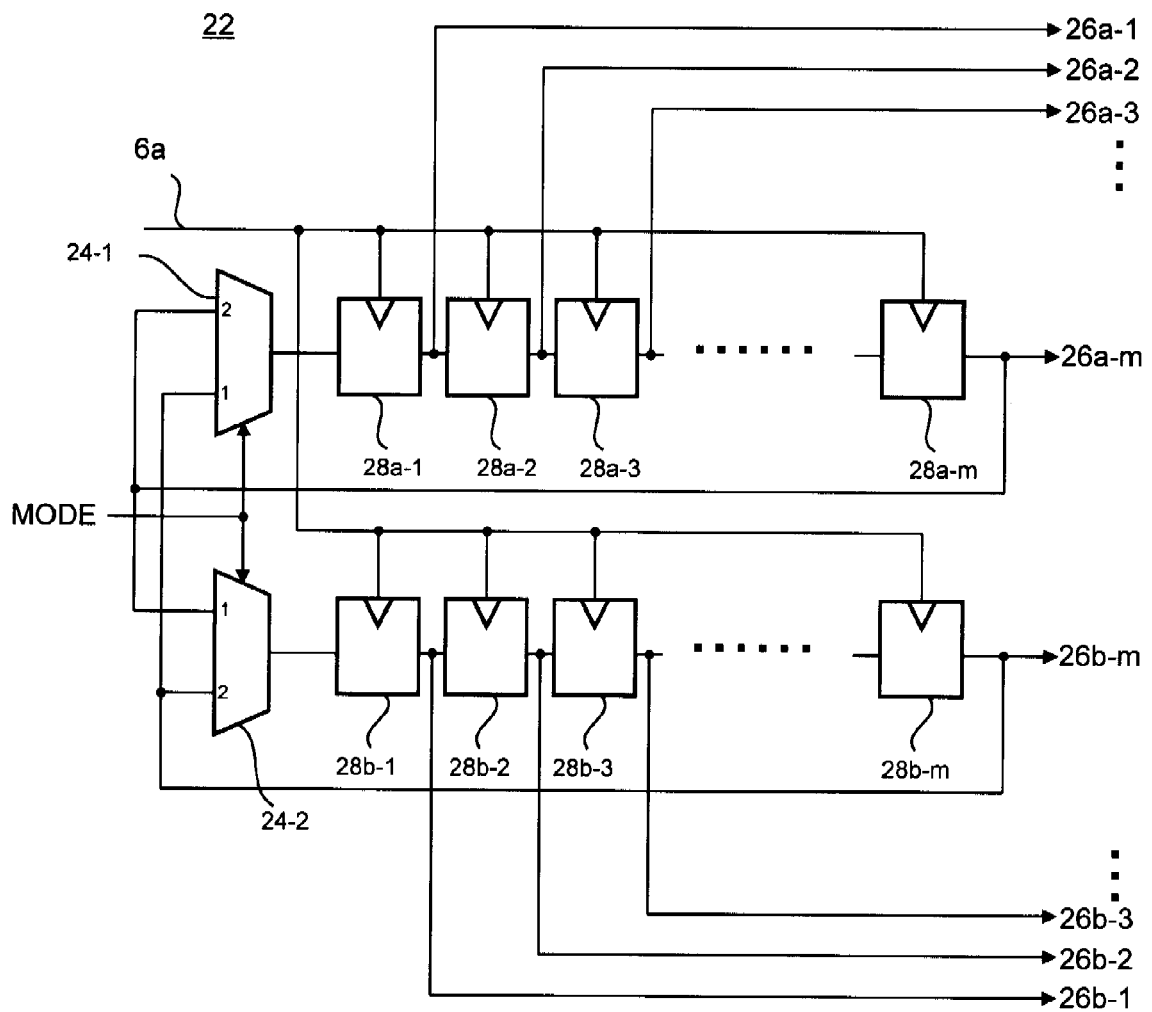
FIG. 3 is a circuit diagram of a command counter shown in FIG. 2.

FIG. 3 is a circuit diagram of the command counter 22.

As shown in FIG. 3, the command counter 22 has a ring counter configuration in which shift registers 28a-1 to 28a-m and 28b-1 to 28b-m are connected in circulation. These shift registers 28a-l to 28a-m and 28b-1 to 28b-m are commonly supplied the internal command 6a.

The command counter 22 is provided with multiplexers 24-1 and 24-2. When a mode signal MODE indicates the first operation mode, an input node 1 of the multiplexers 24-1 and 24-2 is selected. As a result, the shift registers 28a-1 to 28a-m and 28b-1 to 28b-m function as one ring counter, i.e., function as one counter capable of counting 2m. On the other hand, when the mode signal MODE indicates the second operation mode, an input node 2 of the multiplexers 24-1 and 24-2 is selected. As a result, the shift registers 28a-1 to 28a-m function as one ring counter, and the shift registers 28b-1 to 28b-m function as one ring counter. That is, the both shift registers function as two counters each capable of counting m.

The number (=m) of shift registers 28a-1 to 28a-m connected in circulation in the second operation mode is equal to the number of latch circuits included in one FIFO unit 21a-1 to 21a-n. Outputs of each shift register are supplied to the corresponding input gates 26a-1 to 26a-m shown in FIG. 2. Similarly, also the number (=m) of shift registers 28b-1 to 28b-m connected in circulation in the second operation mode is equal to the number of latch circuits included in one FIFO unit 21b-1 to 21b-n. Outputs of each shift registers are supplied to the corresponding input gates 26b-i to 26b-m. Specifically, the outputs of the shift registers 28a-1 to 28a-m are supplied to the input gates 26a-1 to 26a-m, respectively. The outputs of the shift registers 28b-1 to 28b-m are supplied to the input gates 26b-1 to 26b-m, respectively.

When the first operation mode is selected, in the shift registers 28a-1 to 28a-m and 28b-1 to 28b-m, an active level (high level, for example) is latched to any one of the shift registers, and inactive levels (low levels, for example) are latched to the other shift registers. Accordingly, when the first operation mode is selected, any one of the input gates 26a-1 to 26a-m and 26b-1 to 26b-m included in each FIFO unit 21a-1 to 21a-n and 21b-1 to 21b-n is brought into ON state by the command counter 22.

On the other hand, when the second operation mode is selected, the active level is latched to any one of the shift registers 28a-1 to 28a-m and any one of the shift registers 28b-1 to 28b-m. Accordingly, when the second operation mode is selected, any one of the input gates 26a-1 to 26a-m included in each FIFO unit 21a-1 to 21a-n is brought into ON state by the command counter 22, and any one of the input gates 26b-1 to 26b-m included in each FIFO unit 21b-1 to 21b-n is brought into ON state by the command counter 22. That is, when the second operation mode is selected, the command counter 22 brings the two input gates into ON state.

When the internal command 6a is supplied, a position of the shift register which latches the active level is moved within the command counter 22, and thus, the selected input gates are switched.

Figure 4:
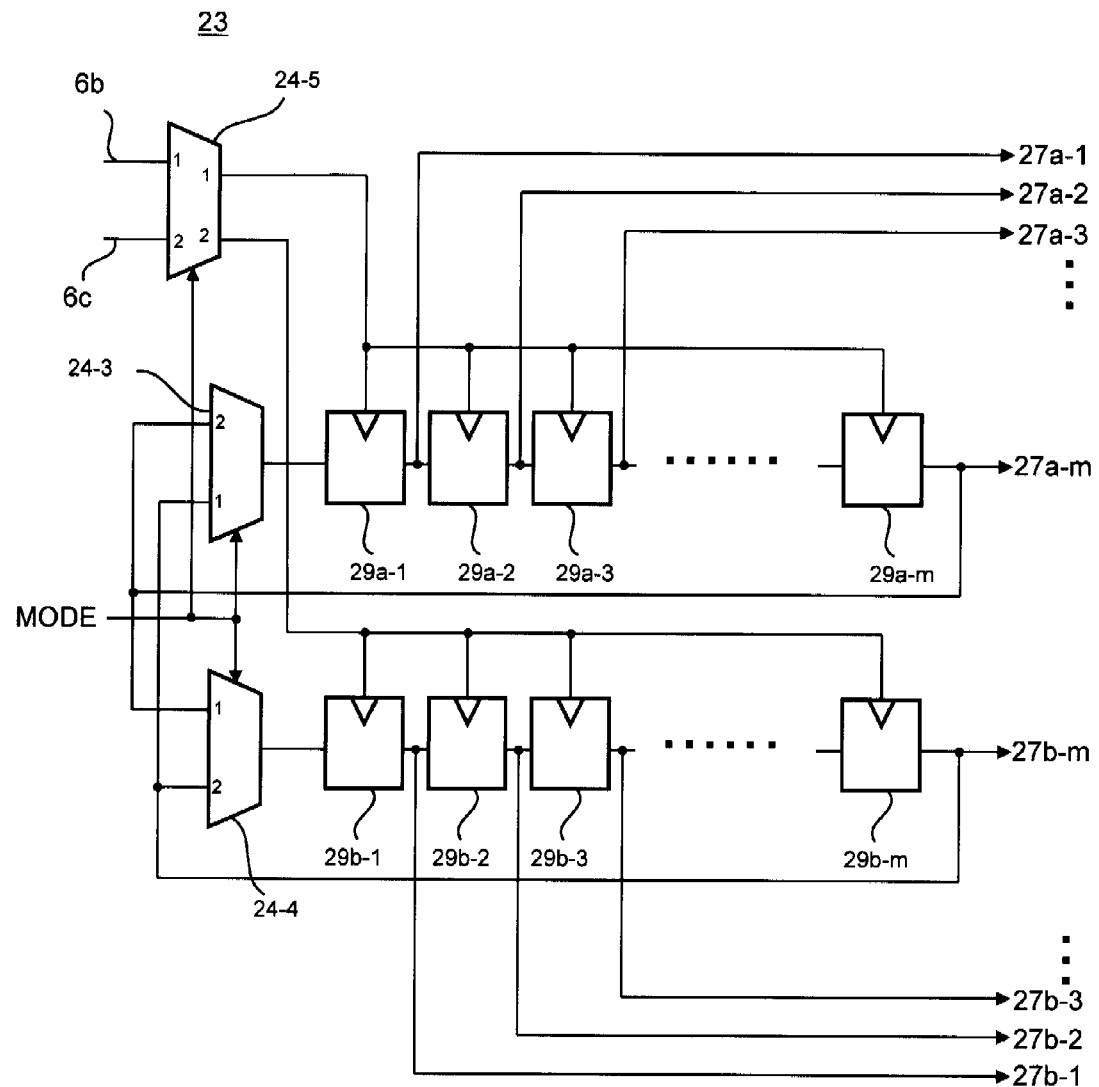
FIG. 4 is a circuit diagram of a command counter shown in FIG. 2.

FIG. 4 is a circuit diagram of the command counter 23.

As shown in FIG. 4, the command counter 23 has a configuration which resembles that of the command counter 22. That is, the command counter 23 has a ring counter configuration in which shift registers 29a-1 to 29a-m and 29b-1 to 29b-m are connected in circulation.

The command counter 23 includes multiplexers 24-3 and 24-4. When the mode signal MODE indicates the first operation mode, an input node 1 of the multiplexers 24-3 and 24-4 is selected. As a result, the shift registers 29a-1 to 29a-m and 29b-1 to 29b-m function as one ring counter, i.e., function as one counter capable of counting 2m. On the other hand, when the mode signal MODE indicates the second operation mode, an input node 2 of the multiplexers 24-3 and 24-4 is selected. As a result, the shift registers 29a-1 to 29a-m function as one ring counter, and the shift registers 29b-1 to 29b-m function as one ring counter. That is, the both shift registers function as two counters each capable of counting m.

In the command counter 23, a multiplexer 24-5 is further employed. The multiplexer 24-5 is a circuit that switches internal commands supplied to the shift registers 29a-1 to 29a-m and 29b-1 to 29b-m. Specifically, when the mode signal MODE indicates the first operation mode, an internal command 6b or 6c is commonly outputted from the output nodes 1 and 2. When the mode signal MODE indicates the second operation mode, the internal command 6b is outputted from the output node 1 and the internal command 6c is outputted from the output node 2.

The number (=m) of shift registers 29a-1 to 29a-m connected in circulation in the second operation mode is equal to the number of latch circuits included in one FIFO unit 21a-1 to 21a-n. Outputs of each shift registers are supplied to the corresponding output gates 27a-1 to 27a-m. Similarly, also the number (=m) of shift registers 29b-1 to 29b-m connected in circulation in the second operation mode is equal to the number of latch circuits included in one FIFO unit 21b. Outputs of each shift registers are supplied to the corresponding output gates 27b-l to 27b-m. Specifically, the outputs of the shift registers 29a-1 to 29a-m are supplied to the output gates 27a-1 to 27a-m, respectively. The outputs of the shift registers 29b-1 to 29b-m are supplied to the output gates 27b-1 to 27b-m, respectively.

When the first operation mode is selected, in the shift registers 29a-1 to 29a-m and 29b-1 to 29b-m, an active level (high level, for example) is latched to any one of the shift registers, and inactive levels (low levels, for example) are latched to the other shift registers. Accordingly, when the first operation mode is selected, any one of the output gates 27a-1 to 27a-m and 27b-1 to 27b-m included in each FIFO unit 21a-1 to 21a-n and 21b-1 to 21b-n is brought into ON state by the command counter 23.

On the other hand, when the second operation mode is selected, the active level is latched to any one of the shift registers 29a-1 to 29a-m and any one of the shift registers 29b-1 to 29b-m. Accordingly, when the second operation mode is selected, any one of the output gates 27a-1 to 27a-m included in each FIFO unit 21a-1 to 21a-n the is brought into ON state by the command counter 23, and any one of the output gates 27b-1 to 27b-m included in each FIFO unit 21b-1 to 21b-n is brought into ON state by the command counter 23. That is, when the second operation mode is selected, the command counter 23 brings the two output gates into ON state.

When the internal commands 6b and 6c are supplied, a position of the shift register which latches the active level is moved within the command counter 23, and thus, the selected output gates are switched.

Returning to FIG. 2, the outputs of the FIFO units 21a-1 to 21a-n and 21b-1 to 21b-n are supplied via a gate circuit 70 to an input node 1 of the multiplexer 80, and directly supplied to an input node 2 of the multiplexer 80. The multiplexer 80 selects the input node 1 when the mode signal MODE indicates the first operation mode, and selects the input node 2 when the mode signal MODE indicates the second operation mode. Thereby, when the mode signal MODE indicates the first operation mode, the outputs of the FIFO units 21a-1 to 21a-n and 21b-1 to 21b-n are commonly outputted as address signals 2a and 2b, and when the mode signal MODE indicates the second operation mode, the outputs of the FIFO units 21a-1 to 21a-n and 21b-1 to 21b-n are outputted separately as the address signals 2a and 2b, respectively.

The address signal 2a is supplied to the I/O circuit 50, and the address signal 2b is supplied to the column selection circuit 40.

An operation of the address counter 20 is explained next.

Figure 5:
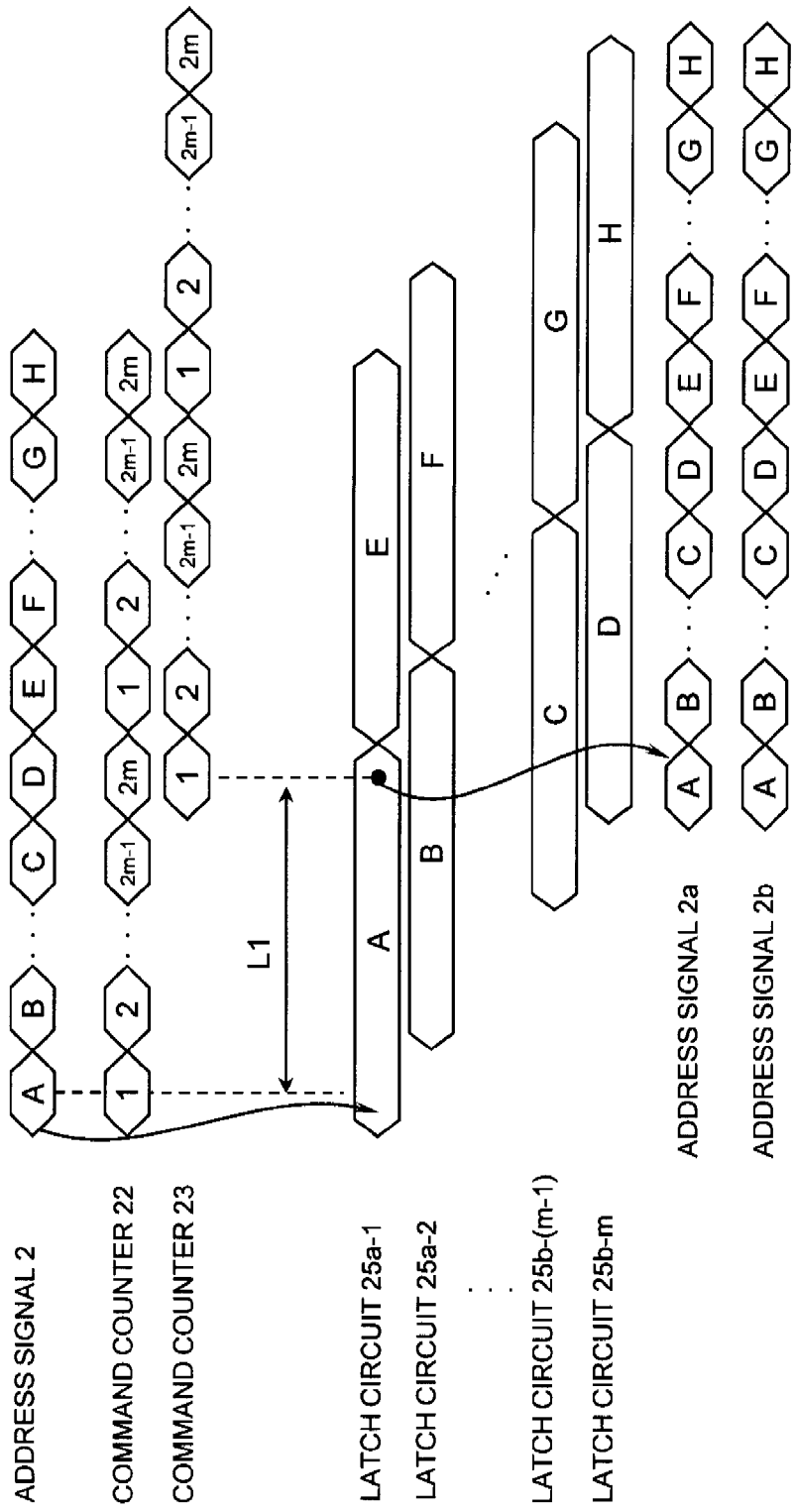
FIG. 5 is a timing chart for explaining an operation of the address counter when a first operation mode is selected.

FIG. 5 is a timing chart for explaining an operation of the address counter 20 when the first operation mode is selected.

As described above, when the first operation mode is selected, the command counters 22 and 23 function as counters each capable of counting 2m. In an example shown in FIG. 5, in sequence with a change of the address signal 2 inputted to the address counter 20, count values of the command counters 22 and 23 change as 1, 2, 3, 4, . . . . When the count value of the command counter 22 is 1 to m, the input gates 26a-1, 26a-2, 26a-3, 26a-4, . . . are successively conducted, and when the count value of the command counter 22 is m+1 to 2m, the input gates 26b-1, 26b-2, 26b-3, 26b-4, . . . are successively conducted. As a result, values A, B, C, D, . . . of the address signal 2 are latched successively to the latch circuits 25a-1, 25a-2, . . . , 25b-1, 25b-2, . . . . That is, up to 2m addresses are accumulated in the address counter 20.

When the first operation mode is selected, generation timings of the internal commands 6b and 6c are simultaneous (or only one of these is activated). Thus, also a count value of the command counter 23 changes as 1, 2, 3, 4, . . . , with a predetermined latency. In an example shown in FIG. 5, a latency of the internal command 6b or 6c to the internal command 6a is L1, and accordingly, the command counter 23 shows the count value after a lapse of an L1 time since the command counter 22 shows a predetermined count value.

Thus, the address signal 2 latched to the latch circuits 25a-1, 25a-2, . . . , 25b-1, 25b-2, . . . is outputted simultaneously as the address signals 2a and 2b after a lapse of the L1 time since being latched.

As described above, when the first operation mode is selected, the generation timings of the address signals 2a and 2b are concurrent. However, instead thereof, it becomes possible to enlarge the accumulation number of the address signal 2 to 2m. Thus, when tCCD is small, it is particularly effective.

Figure 6:
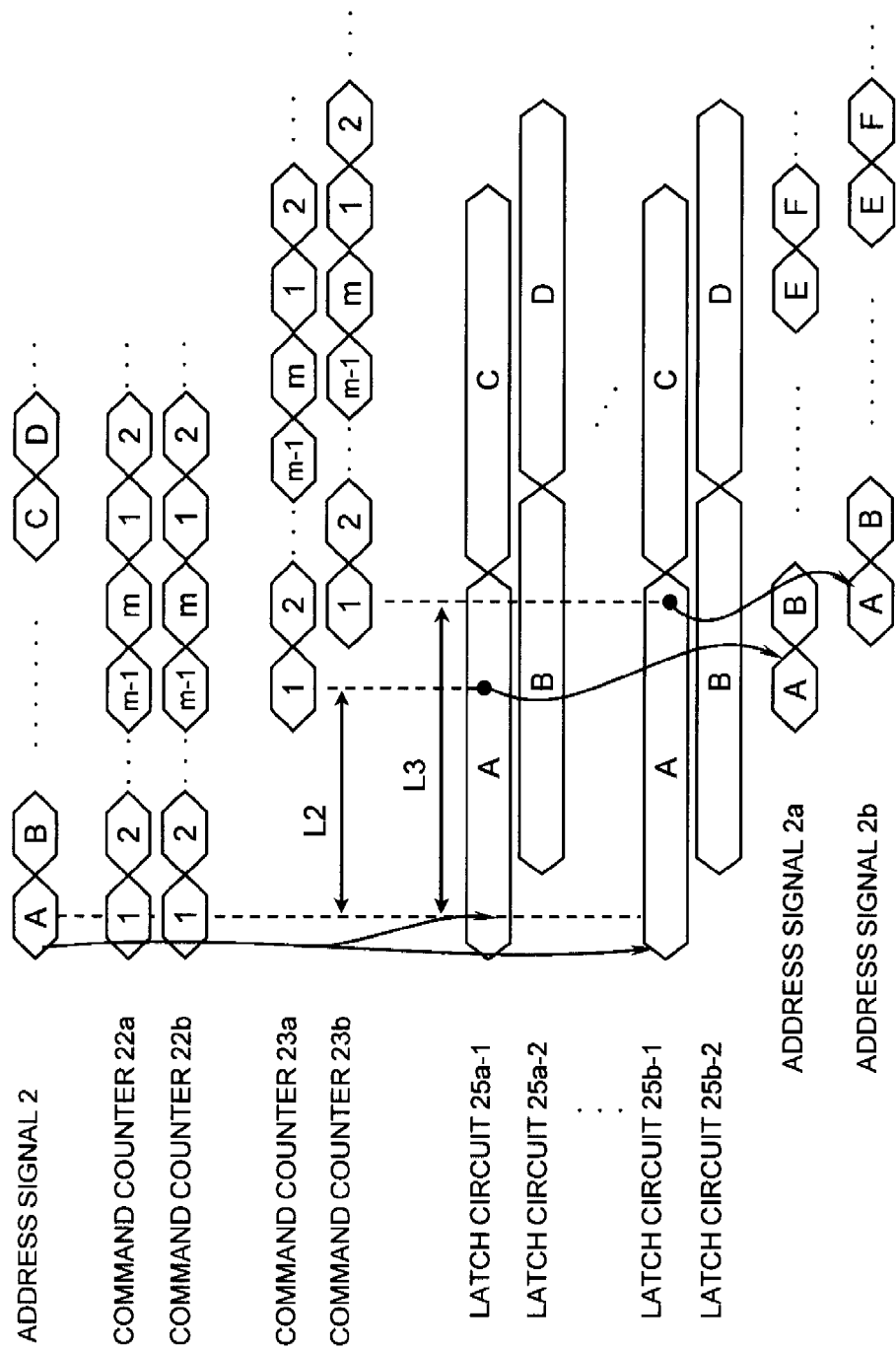
FIG. 6 is a timing chart for explaining an operation of the address counter when a second operation mode is selected.

FIG. 6 is a timing chart for explaining an operation of the address counter 20 when the second operation mode is selected.

As described above, when the second operation mode is selected, the command counters 22 and 23 function as two counters each capable of counting m. In FIG. 6, of the command counter 22, a portion formed of the shift registers 28a-1 to 28a-m is indicated as a command counter 22a, and a portion formed of the shift registers 28b-1 to 28b-m is indicated as a command counter 22b. Similarly, of the command counter 23, a portion formed of the shift registers 29a-1 to 29a-m is indicated as a command counter 23a, and a portion formed of the shift registers 29b-1 to 29b-m is indicated as a command counter 23b.

In an example shown in FIG. 6, in sequence with a change of the address signal 2 inputted to the address counter 20, count values of the command counters 22a and 22b change simultaneously. This is because both the command counters 22a and 22b perform a count operation in response to the internal command 6a. On the other hand, count values of the command counters 23a and 23b change individually. This is because the command counter 23a performs a count operation in response to the internal command 6b, and the command counter 23b performs a count operation in response to the internal command 6c.

The count value of the command counter 22a corresponds to each branch number of the input gates 26a-1 to 26a-m, and thus, the input gates 26a-1, 26a-2, . . . are successively conducted. Similarly, the count value of the command counter 22b corresponds to each branch number of the input gates 26b-1 to 26b-m, and thus, the input gates 26b-1, 26b-2, . . . are successively conducted. As a result, a value A of the address signal 2 is latched to the latch circuits 25a-1 and 25b-1, and a value B of the address signal 2 is latched to the latch circuits 25a-2 and 25b-2. That is, up to m addresses are accumulated in the address counter 20.

When the second operation mode is selected, the generation timings of the internal command 6b and 6c are individual. Thus, in response to each of the internal commands 6b and 6c, also the count values of the command counters 23a and 23b change as 1, 2, 3, 4, . . . , with a predetermined latency.

The count value of the command counter 23a corresponds to each branch number of the output gates 27a-1 to 27a-m, and the count value of the command counter 23b corresponds to each branch number of the output gates 27b-1 to 27b-m. Accordingly, the value A of the address signal latched to the latch circuits 25a-1 and 25b-1 is outputted as the address signal 2a when the count value of the command counter 23a indicates 1, and outputted as the address signal 2b when the count value of the command counter 23b indicates 1.

In an example shown in FIG. 6, a latency of the internal command 6b to the internal command 6a is L2, and accordingly, the command counter 23a shows the count value after a lapse of an L2 time since the command counter 22a shows a predetermined count value. Similarly, a latency of the internal command 6c to the internal command 6a is L3, and accordingly, the command counter 23b shows the count value after a lapse of an L3 time since the command counter 22b shows a predetermined count value.

Thus, the address signal 2 latched to the latch circuits 25a-1, 25a-2, . . . , 25b-1, 25b-2, . . . is outputted as the address signal 2a after a lapse of the L2 time since being latched, and outputted as the address signal 2b after a lapse of the L3 time since being latched.

Thus, when the second operation mode is selected, the accumulation number of the address signal 2 is limited to m. However, instead thereof, it becomes possible to individually control the generation timings of the address signals 2a and 2b.

Thus, the address counter according to the first embodiment has the first operation mode in which a plurality of FIFO units are collectively used, and the second operation mode in which a plurality of FIFO units are divided in two and used. Accordingly, in a case that tCCD is small, when the generation timings of the address signals 2a and 2b are rendered simultaneous, a circuit scale of the address counter can be reduced. Further, resulting from a reduction of the number of latch circuits, a consumed power is reduced and a load of the address signal 2 is reduced as well, and thus, a high-speed access can be also achieved.

A second embodiment of the present invention is explained next.

Figure 7:
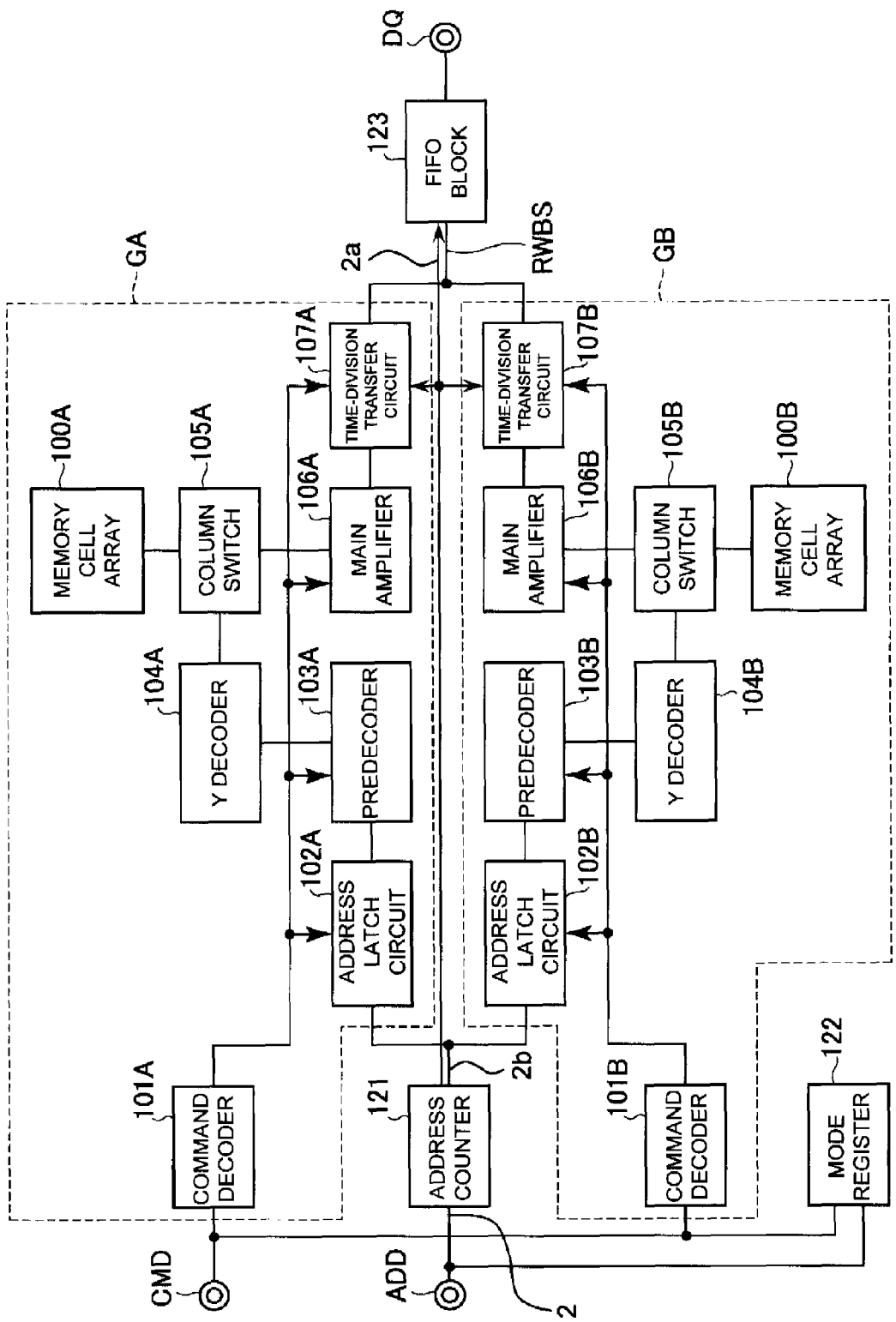
FIG. 7 is a block diagram showing a configuration of a main part of a semiconductor memory device according to a second embodiment of the present invention.

FIG. 7 is a block diagram showing a configuration of a main part of a semiconductor memory device according to the second embodiment of the present invention. In FIG. 7, only column system circuits and data system circuits, which are characteristic parts of the semiconductor memory device, are shown, and row system circuits or the like are omitted.

The semiconductor memory device is a DDR3 synchronous DRAM and a prefetch number is 8 bits. With respect to a burst length (BL), at least BL=4 and BL=8 are selectable. A minimum burst length is BL=4.

As shown in FIG. 7, in the semiconductor memory device, most of circuits are divided into two groups (group GA and group GB). However, an address counter 121, a mode register 122, and a FIFO block 123 are not grouped. These components are commonly arranged to the two groups.

Out of column addresses 2a and 2b, which are outputs of the address counter 121, the address signal 2a is supplied to a time-division transfer circuits 107A and 107B and the FIFO circuit group 123. The address signal 2b is supplied to address latch circuits 102A and 102B. In the second embodiment, the time-division transfer circuits 107A and 107B and the FIFO circuit group 123 correspond to the I/O circuit 50 shown in FIG. 1.

A column address which is output signal of the address counter 121 is commonly supplied to the groups GA and GB. Thus, one set of column address wirings can be sufficient. The column address is latched to one of the address latch circuits 102A and 102B by control of command decoders 101A and 101B. Thereby, the column address becomes effective to one of the groups GA and GB.

The column address supplied to the group GA is supplied to the address latch circuit 102A, a predecoder 103A, a Y decoder 104A to control a column switch 105A. The column switch 100A is supplied with data read from a memory cell array 100A, and the selected data is supplied to a main amplifier 106A by control of the Y decoder 104A. Output of the main amplifier 106A is supplied to the time-division transfer circuit 107A. The same is true of the group GB.

The reason for the grouping is to realize tCCD=2 in the DDR3 synchronous DRAM of which the prefetch number is 8 bits. A significance to realize tCCD=2 in the DDR3 synchronous DRAM is explained below.

In the DDR3 synchronous DRAM, 8-bit data is read at once from a DRAM core at a time of reading, the 8-bit data is temporarily held in a prefetch circuit, and thereafter, the data is burst-outputted to outside. On the contrary, at a time of writing, the 8-bit data burst-inputted from outside is temporarily held in the prefetch circuit, and thereafter, the 8-bit data is written into the DRAM core at once. To perform such operations, in the synchronous DRAM, the prefetch number is basically defined as a minimum burst length.

However, to realize a faster data transfer rate, it is inevitably necessary to increase the prefetch number. Thus, when the prefetch number is defined as the minimum burst length, it becomes difficult to be compatible with a conventional synchronous DRAM. Using an example of the DDR3 synchronous DRAM, when the minimum burst length is set to 8, an operation at a burst length=4 which is possible in a DDR2 synchronous DRAM cannot be performed. As a result, its compatibility is lost.

To solve such a problem, a "burst chop function" has been proposed. The burst chop function is to designate in advance so that a burst operation stops in a middle of the operation at a time of issuance of a read command or a write command. Accordingly, when an example in which the burst chop function is installed in the DDR3 synchronous DRAM is assumed, by the designation at a time of issuance of the read command or the write command, it becomes possible to use a burst length=8 as a burst length=4. Thereby, even when the prefetch number increases, it becomes possible to be compatible with the conventional product (DDR2).

However, the burst chop function is, after all, to stop the burst operation in the middle of the operation. Thus, an input cycle of the command cannot be shortened. That is, in the DDR3 synchronous DRAM of which the prefetch number is 8 bits, it is possible to receive the command by each 4 clock cycles (tCCD=4), while at a time of the burst chop, an input/output operation is completed in first-half 2 clock cycles, and last-half 2 clock cycles are a waiting time. That is, even when the burst length is shortened to 4 bits by using the burst chop function, it does not mean that the input cycle of the command is automatically shortened to 2 clock cycles (tCCD=2), and the input cycle of the command is still 4 clock cycles. Thus, this poses a problem in that, when the burst chop is performed, a data transfer efficiency is deteriorated.

As a method of solving such a problem, it can be considered to arrange two sets of command decoders or address counters and operate the both sets by shifting by 2 clock cycles. However, in this method, the number of column address wirings and data buses are doubled, and thus, a chip area increases greatly. For example, when a chip in which data inputted and outputted simultaneously is 16 bits (×16 product) is assumed, if the prefetch number is 8, the number of data buses is 128 (=16×8) in a normal chip while two sets of 128 data buses, i.e., as many as 256 data buses, are needed in the chip described above.

Further, in this method, when the burst length=8 is set, it is sufficient that only one of the circuits is operated. However, when the burst length=4 is set, it is necessary that the both circuits are operated. Thus, when the burst length=4 is set, a charge or discharge current of the data bus or the like is doubled as compared to a case of the burst length=8, which poses a problem of power consumption increase.

As described above, to achieve tCCD=2 in the DDR3 synchronous DRAM, there are various problems. The second embodiment is directed to solve such problems while achieving tCCD=2 in the DDR3 synchronous DRAM.

However, when tCCD is shortened, the number of column addresses to be accumulated in the address counter 121 increases. Specifically, when AL=10; CWL=8; BL=4; and tCCD=2, the accumulation number X=12 is established, and thus, as compared to a case that tCCD=4, the circuit scale of the address counter is almost doubled. Accordingly, in the second embodiment, there is particularly a substantial requirement for reducing the circuit scale of the address counter.

Also in the second embodiment, the address counter 121 has a circuit configuration shown in FIG. 2. Accordingly, when the number (=n) of bits of the address signal 2 is 16 bits, for example, 192 (=12×16) latch circuits are needed. Further, the command counters 22 and 23 have circuit configurations shown in FIGS. 3 and 4, respectively, and are each configured by 12 (=X) shift registers. As a result, a total of 216 (=192+12×2) latch circuits or shift registers are used.

Contrary thereto, when a case that a normal point-shift FIFO circuit is used is assumed, if the number of bits of the address signal 2a is 5 bits and that of the address signal 2b is 16 bits, the number of latch circuits required is X×(16+5), and thus, 252 latch circuits are needed. Further, 12 bits of command counters are needed to correspond to the internal commands 6a to 6c each, and thus, when these are added, a total of 288 (=252+36) latch circuits or shift registers are needed. Accordingly, it is understood that when the present invention is applied, the circuit scale is reduced by about 25%.

Explanations of the semiconductor memory device according to the second embodiment will be continued below by focusing on a part related with the read operation.

Figure 8:
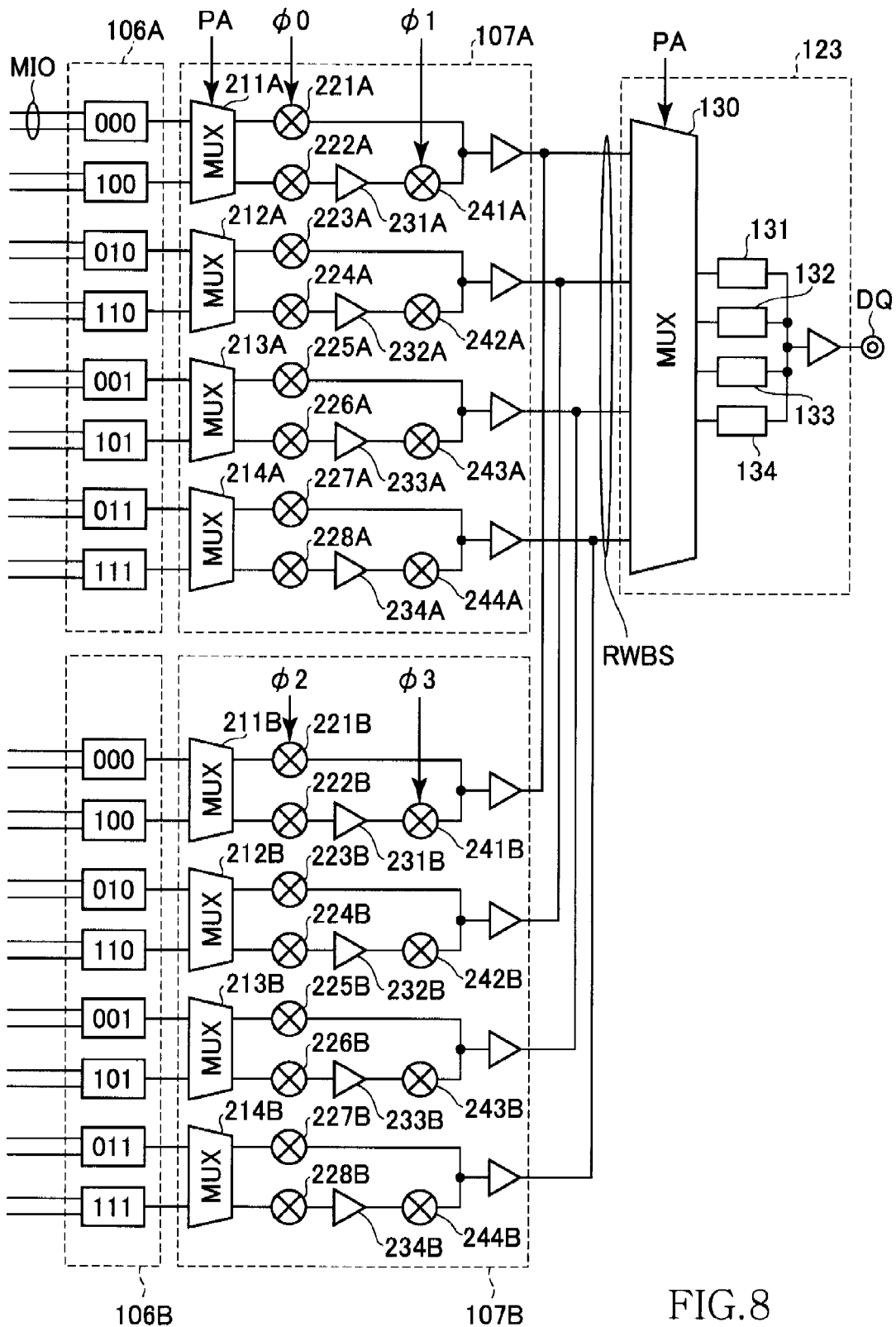
FIG. 8 is a circuit diagram showing in more detail a circuit from the main amplifiers to a data input/output terminal shown in FIG. 7.

FIG. 8 is a circuit diagram showing in more detail a circuit from the main amplifiers 106A and 106B to a data input/output terminal DQ. The circuit shown in FIG. 8 is a portion relating to one data input/output terminal DQ, and accordingly, the same circuits of a number that is equal to the number of bits simultaneously inputted and outputted are needed. For example, in a case of a chip in which data simultaneously inputted and outputted is 16 bits (×16 product) 16 circuits shown in FIG. 8 are needed.

As shown in FIG. 8, from the main amplifiers 106A and 106B, 8-bit data, which is the same number as a prefetch number, are outputted, respectively. In the column address of these data, high-order bits are common, and low-order 3 bits only are different. 3-bit values shown within the main amplifiers 106A and 106B indicate the low-order 3 bits of the column address. The main amplifiers 106A and 106B have a function for converting a complementary signal into a single signal.

Outputs of the main amplifiers 106A and 106B are supplied to the time-division transfer circuits 107A and 107B, respectively. The time-division transfer circuit 107A includes four multiplexers 211A to 214A, eight switches 221A to 228A, four buffers 231A to 234A, and four switches 241A to 244A. The time-division transfer circuit 107B has the same circuit configuration.

The multiplexers 211A to 214A are circuits that switch an association relationship between 2-bit data supplied from the main amplifier 106A and the switches 221A to 228A. The switching is controlled by a prefetch address PA. For example, in the case of the multiplexer 211A, data of which low-order 3-bits are "000" is outputted to the switch 221A or the switch 222A, and data of which low-order 3-bits are "100" is outputted to the switch 222A or the switch 221A. The same is true of the multiplexers 211B to 214B included in the time-division transfer circuit 107B.

As shown in FIG. 8, while outputs of the switches 221A, 223A, 225A, and 227A are directly supplied to a data bus RWBS, outputs of the switches 222A, 224A, 226A, and 228A are supplied via the switches 231A to 234A and 241A to 244A, respectively, to the data bus RWBS. The switches 221A to 228A are circuits rendered conducting in response to a control signal $\phi 0$, and the switches 241A to 244A are circuits rendered conducting in response to a control signal $\phi 1$. Accordingly, based on timings of the control signals $\phi 0$ and $\phi 1$, it is possible to supply the 8-bit data supplied from the main amplifier 106A to the data bus RWBS in a time-division manner by each 4 bits. The above-described configuration and operation are true of those in the time-division transfer circuit 107B.

The data bus RWBS is arranged commonly to the time-division transfer circuits 107A and 107B. Thus, the number of the data buses RWBS is 4. Accordingly, in a case of the ×16 product, the number of the data buses RWBS is 64 (=4×16). Thus, the number is reduced as compared to a conventional case. Since a semiconductor memory device of a type in which a burst chop is performed needs 128 (=8×16) data buses RWBS, the number is reduced to half. Further, a semiconductor memory device of a type in which two sets of command decoders or address counters are simply arranged needs 256 (=8×16×2) data buses RWBS, as described above. Thus, the number is reduced to ¼.

As shown in FIG. 8, the data buses RWBS are connected to the FIFO block 123. The FIFO block 123 includes a multiplexer 130 and four FIFO circuits 131 to 134. The multiplexer 130 is a circuit that switches an association relationship between the 4-bit data supplied via the data bus RWBS and the FIFO circuits 131 to 134. The switching is controlled by the prefetch address PA.

The FIFO circuits 131 to 134 can each hold read data of (CL+BL/2)/2, where CL is a CAS latency. Accordingly, when BL=8 is established, at least 2-bit read data can be held. Thereby, the FIFO circuits 131 to 134 become capable of holding 8-bit read data which is the same as the prefetch number. At the time of outputting data, the read data stored in the FIFO circuits 131 to 134 are outputted in this order in synchronization with an external clock signal (CK).

Figure 9:
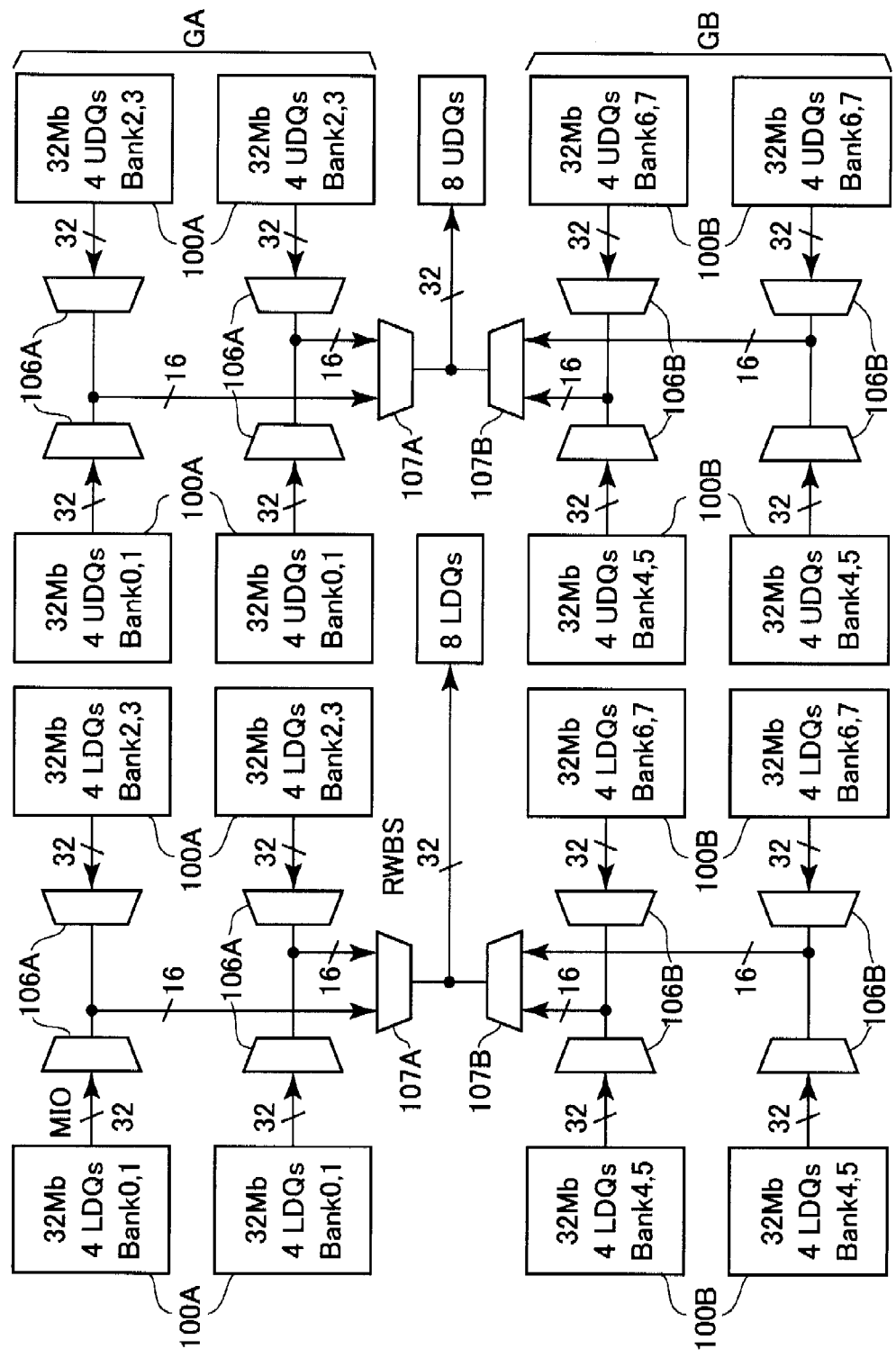
FIG. 9 is a schematic layout chart of the semiconductor memory device according to the second embodiment.

FIG. 9 is a schematic layout chart of the semiconductor memory device according to the present embodiment. This example shows a 512M-bit memory of which prefetch number is 8 bits and input/output bit number is 16 bits (×16 product)

As shown in FIG. 9, in this example, the memory cell array is divided into 8 banks (a bank 0 to a bank 7), and out of these banks, the banks 0 to 3 belong to the group GA and the banks 4 to 7 belong to the group GB. Each of the banks 0 to 7 is divided into four memory mats, and 16-bit data simultaneously inputted and outputted are allotted to the four memory mats by each 4 bits. In the semiconductor memory device, the prefetch number is 8 bits, and thus, 32-bit (=4×8) data is simultaneously inputted and outputted to/from each memory mat.

Subsequently, an operation of the semiconductor memory device is described.

Figure 10:
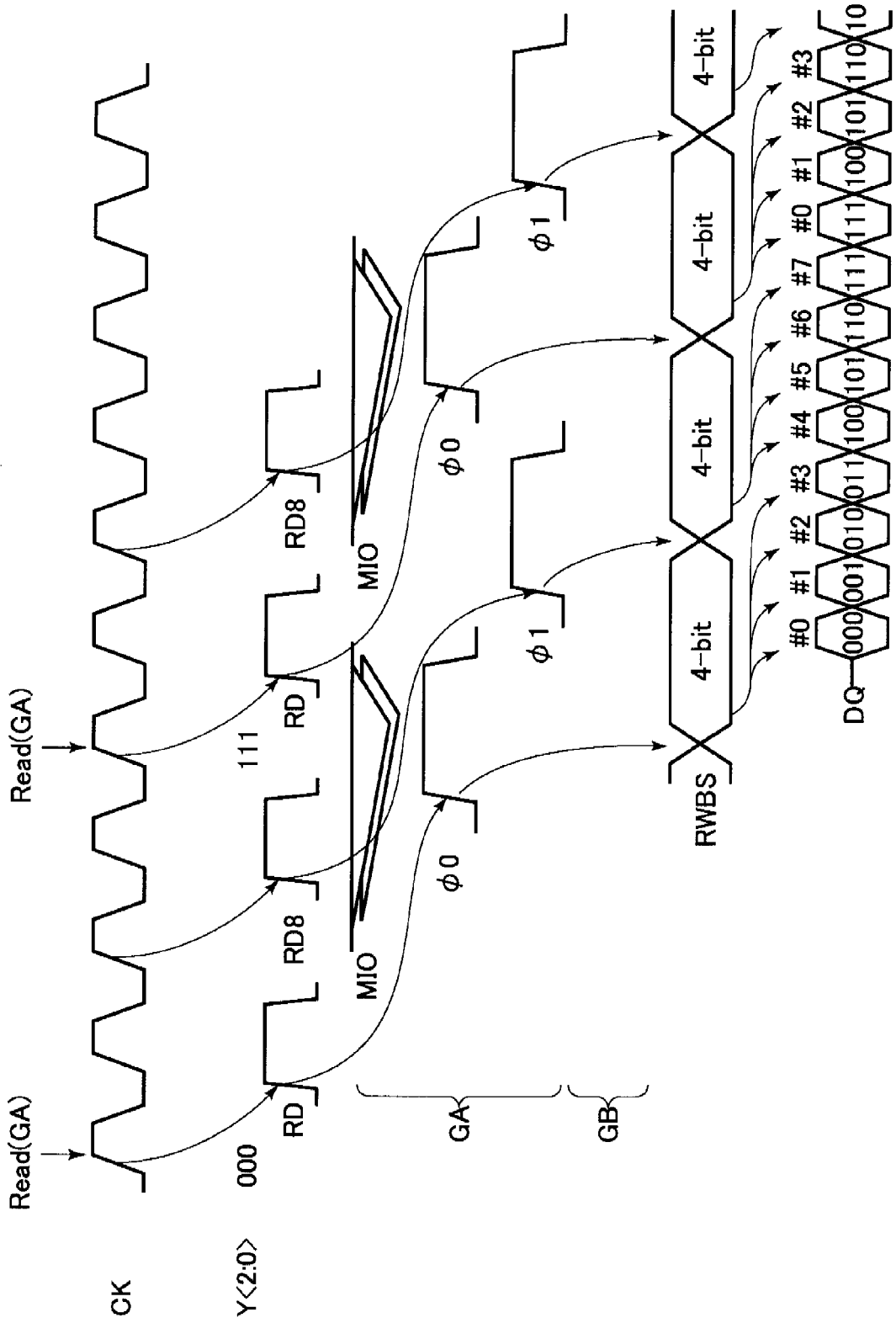
FIG. 10 is a timing chart showing an operation when the burst length is set to 8 bits (BL=8)

FIG. 10 is a timing chart showing an operation when the burst length is set to 8 bits (BL=8). Setting of the burst length is performed by issuing a command of a mode register set, and thereafter, setting to the mode register 122 shown in FIG. 7 a mode signal indicating the burst length.

As shown in FIG. 10, when BL=8 is set, the input cycle of the command (a read command, in the example shown in FIG. 10) is 4 clock cycles. That is, it is possible to receive the command by each 4 clock cycles (tCCD=4).

Firstly, when a first read command is issued, the command decoder 101A generates an internal command RD, and in response thereto, a read operation is begun within the group GA. When BL=8 is set, the command decoder 101A generates the internal command RD, and thereafter, generates an internal command RD8 with a delay of 2 clock cycles.

Data of 8 bits per DQ read in response to the internal command RD is amplified by the main amplifier 106A, and supplied to the time-division transfer circuit 107A. Thereafter, the control signal φ0 that responds to the internal command RD is rendered active, and further, the control signal φ1 that responds to the internal command RD8 is rendered active with a delay of 2 clock cycles. When the control signal φ0 is rendered active, 4 bits, out of read 8 bits, are supplied to the data bus RWBS, and these 4-bit data are transferred to the FIFO block 123.

These 4-bit read data are respectively stored in the FIFO circuits 131 to 134, and are burst-outputted in synchronization with the external clock signal CK. While such burst output is being performed, the control signal φ1 is rendered active this time, and the remaining 4 bits are supplied to the data bus RWBS. Thereafter, subsequent to the burst output of the first-half 4 bits, the last-half 4 bits are burst-outputted. Thereby, BL=8 is achieved.

Subsequently, when a second read command is issued with a delay of 4 clock cycles from the issuing of the first read command, the operation similar to that described above is performed.

In the example shown in FIG. 10, a case where a burst type is a sequential mode is shown. The low-order 3 bits of the column address that corresponds to the first read command is "000", and the low-order 3 bits of the column address that corresponds to the second read command is "111". Thereby, in the burst output that corresponds to the first read command, data having the column address of which low-order 3 bits are "000" is firstly outputted, and in the burst output that corresponds to the second read command, data having the column address of which low-order 3 bits are "111" is firstly outputted. Such control can be possible by controlling the multiplexers 211A to 214A, 211B to 214B, and 130, based on the prefetch address PA shown in FIG. 8.

Thus, when BL=8 is set, only one of the groups GA and GB is operated, and the other group is not operated. The data transfer using the data bus RWBS is performed in units of 4 bits. Thus, an operation frequency of the data bus RWBS is doubled as compared to the conventional case. However, due to the decrease in number of data buses RWBS, it becomes possible to arrange a shield wiring between the adjacent data buses. Thus, nearly no signal quality deterioration is caused due to the doubled operation frequency.

That is, when the shield wirings are interposed, respectively, among 64 data buses RWBS, the number of wirings is 128, similar to the conventional case where the burst chop is performed. However, the shield wiring can be not a signal line but a power supply wiring, for example. Thus, it is possible to use a wiring thinner than the data bus RWBS. As a result, it becomes possible to make a wiring width of the data bus RWBS thick.

More specifically, while L/S (line and space) of the data bus RWBS in the conventional case where the burst chop is performed is 1.0/1.0 μm, the L/S of the data bus RWBS can be expanded to 1.2/1.2 μm in the semiconductor memory device according to the embodiment. As a result, a signal delay is not only decreased, but coupling noise between the adjacent wirings can also be decreased. Thus, there is nearly no signal quality deterioration caused due to the increase in operation frequency.

Figure 11:
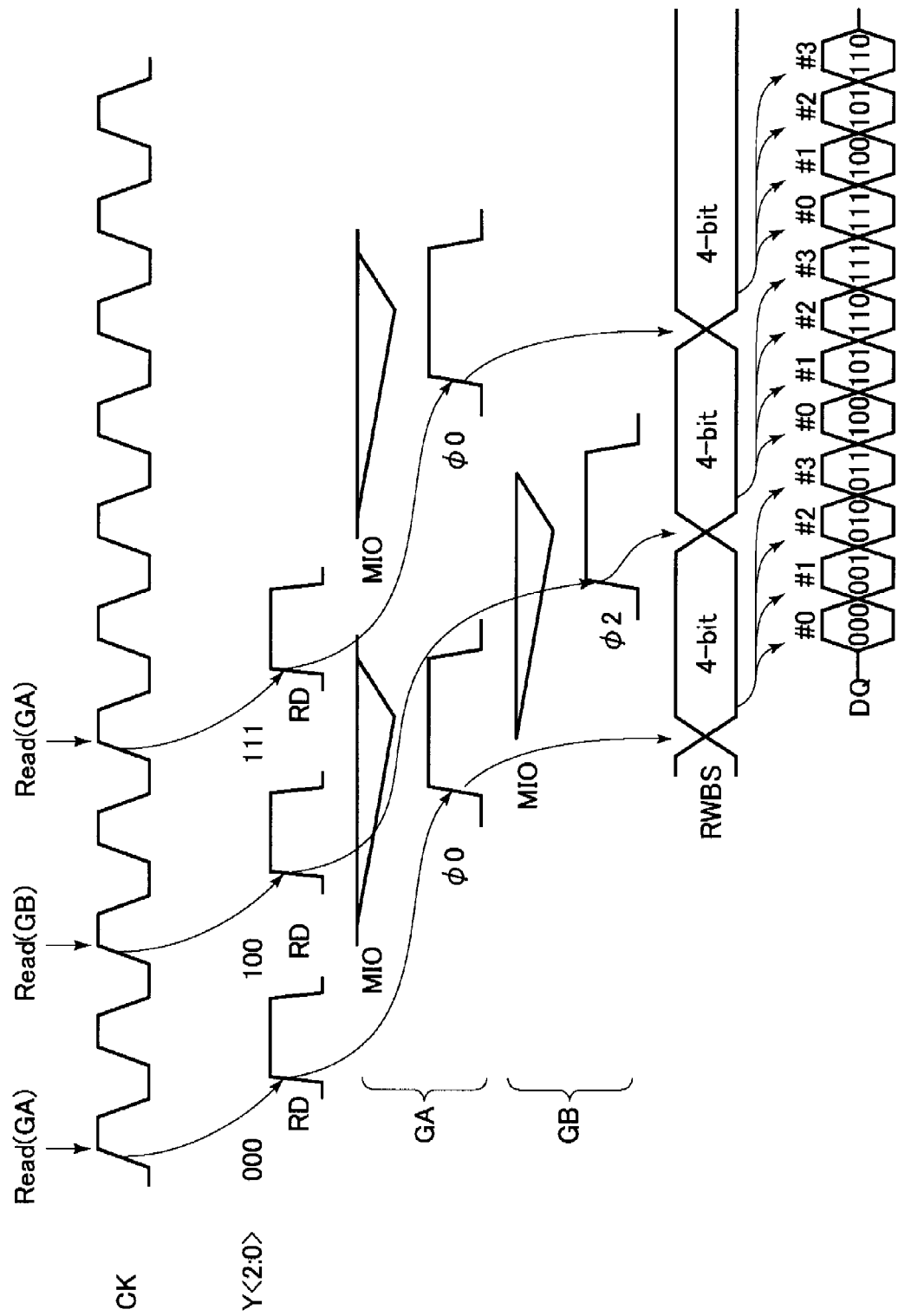
FIG. 11 is a timing chart showing an operation when the burst length is set to 4 bits (BL=4)

FIG. 11 is a timing chart showing an operation when the burst length is set to 4 bits (BL=4).

As shown in FIG. 11, when BL=4 is set, the input cycle of the command (the read command, in the example shown in FIG. 11) is 2 clock cycles. That is, it is possible to receive the command by each 2 clock cycles (tCCD=2).

Firstly, when the first read command is issued, the command decoder 101A generates the internal command RD, and in response thereto, the read operation is performed within the group GA. When BL=4 is set, the internal command RD8 is not generated.

The data of 8 bits per DQ read in response to the internal command RD is amplified by the main amplifier 106A, and supplied to the time-division transfer circuit 107A. Thereafter, when the control signal φ0 is rendered active in response to the internal command RD, 4 bits, out of read 8 bits, are supplied to the data bus RWBS, and the 4-bit data are transferred to the FIFO block 123. On the other hand, when BL=4 is set, the control signal φ1 is not rendered active, and thus, the remaining 4 bits are not supplied to the data bus RWBS.

Subsequently, when the second read command is issued with a delay of 2 clock cycles from the issuing of the first read command, the command decoder 101B generates the internal command RD this time, and in response thereto, the read operation is performed within the group GB. The data of 8 bits per DQ thereby read is amplified by the main amplifier 106B, and is supplied to the time-division transfer circuit 107B. Thereafter, when the control signal φ2 is rendered active in response to the internal command RD, 4 bits, out of read 8 bits, are supplied to the data bus RWBS, and the 4-bit data are transferred to the FIFO block 123. Again, a control signal φ3 is not rendered active, and thus, the remaining 4 bits are not supplied to the data bus RWES.

Subsequently in a similar manner, the groups GA and GB are alternately operated. Thus, BL=4 can be achieved. In this manner, in the semiconductor memory device according to the embodiment, in the operation at BL=4, the data transfer using the data bus RWBS is also performed in units of 4 bits.

In the example shown in FIG. 11, a case where the burst type is a sequential mode is shown. The low-order 3 bits of the column address corresponding to the first read command is "000", the low-order 3 bits of the column address corresponding to the second read command is "100", and the low-order 3 bits of the column address corresponding to the third read command is "111". Thus, in the burst output corresponding to the first read command, the data having the column address of which low-order 3 bits are "000" is firstly outputted, and the data of which low-order 3 bits are "100" to "111" are not outputted. Likewise, in the burst output corresponding to the second or third read command, the data having the column address of which low-order 3 bits are "100" or "111" is firstly outputted, and the data of which low-order 3 bits are "000" to "011" are not outputted.

As described above, in the semiconductor memory device according to the embodiment, the data transfer using the data bus RWBS is performed in units of 4 bits, which is the minimum burst length, irrespective of the burst length. Thus, a need of performing the burst chop can be eliminated. Further, the data transfer cycle using the data bus is constant irrespective of the input cycle of the command. Thus, it becomes possible to inhibit an increase in circuit scale or an increase in power consumption.

According to the present invention, the data transfer using the data bus is performed in units of m bits, which is the minimum burst length, irrespective of the burst length set to the mode register. Thus, it becomes possible to set the burst length smaller than a prefetch number without performing a burst chop. Further, a data transfer cycle using the data bus is constant irrespective of an input cycle of the command. Thus, it becomes possible to inhibit an increase in circuit scale or an increase in power consumption.

The present invention can preferably apply to the semiconductor memory device, especially a DRAM.

Figure 12:
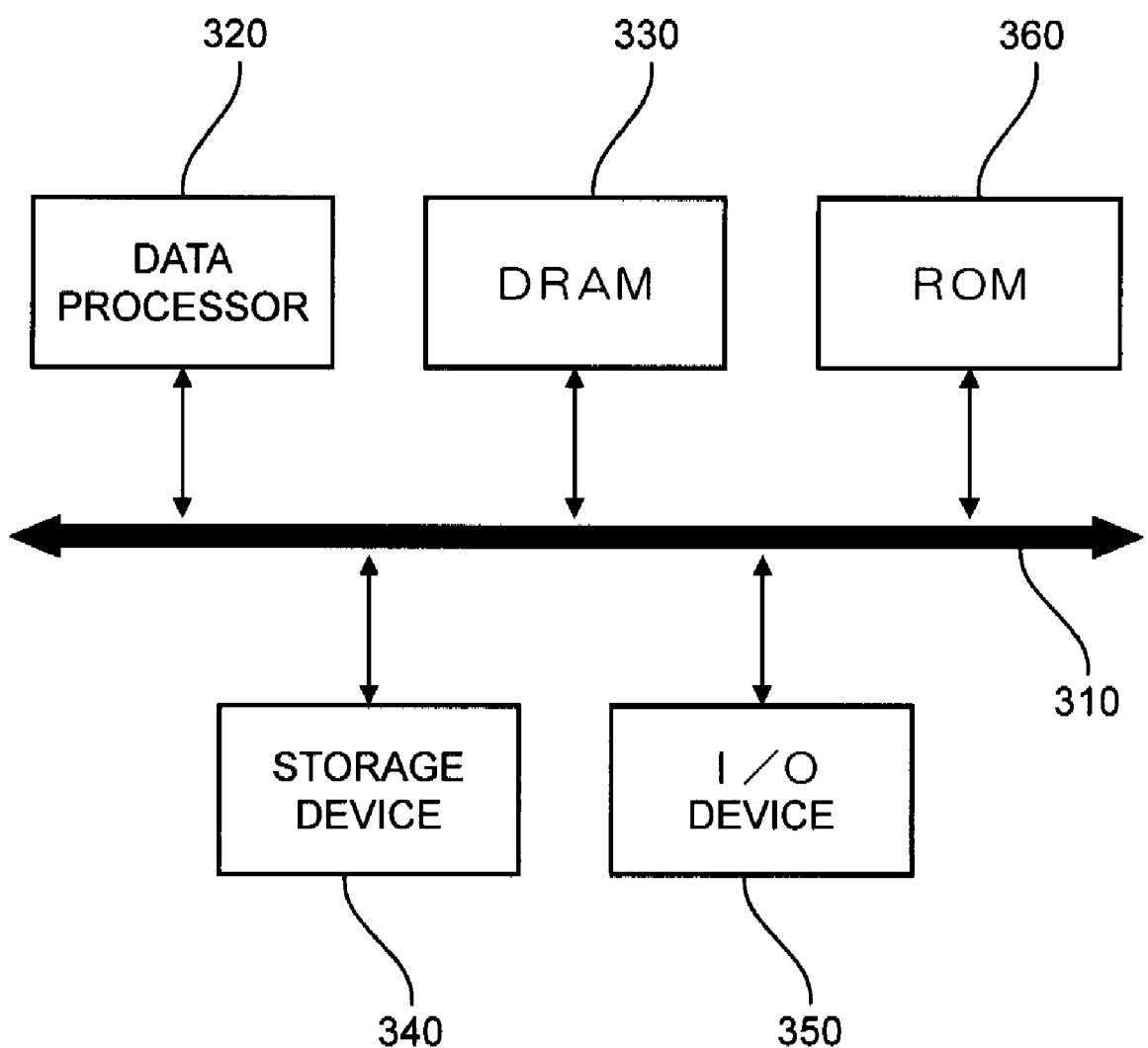
FIG. 12 is a block diagram showing a data processing system using the DRAM that the present invention is applied.

FIG. 12 is a block diagram showing a data processing system 300 using the DRAM that the present invention is applied.

The data processing system 300 shown in FIG. 12 includes a data processor 320 and a DRAM 330 that the present invention is applied are connected to each other via a system bus 310. The data processor 320 can be selected from at least a microprocessor (MPU) and a digital signal processor (DSP). In FIG. 12, although the data processor 320 and the DRAM 330 are connected via the system bus 310 in order to simplify the diagram, they can be connected via not the system bus 310 but a local bus.

Further, in FIG. 12, although only one set of system bus 310 is employed in the data processing system 300 in order to simplify the diagram, a serial bus or a parallel bus connected to the system bus 310 via connectors can be provided. As shown in FIG. 12, a storage device 340, an I/O device 350, and a ROM 360 are connected to the system bus 310. However, they are not essential element for the data processing system 300.

The storage device 340 can be selected from at least a hard disk drive, an optical disk drive, and flash memory device. The I/O device 350 can be selected from a display device such as a liquid crystal display (LCD) and an input device such as a key board or a mouse. The I/O device 350 can consists of either input or output device. Further, although each one element is provided as shown in FIG. 12, two or more same elements can be provided in the data processing system.

The present invention is in no way limited to the aforementioned embodiments, but rather various modifications are possible within the scope of the invention as recited in the claims, and naturally these modifications are included within the scope of the invention.

For example, the first and second operation modes are provided in the above embodiments. In the first operation mode, the FIFO units are collectively used, and in the second operation mode, the FIFO units are divided in two and used. However, the present invention is not limited thereto, and operation modes in which FIFO units are divided in three and used can be provided.

Further, while the command counters 22 and 23 have a ring counter configuration in the above embodiments, the present invention is not limited thereto. However, when the ring counter configuration is adopted, it becomes possible to change the count value at a higher speed as compared to a case that a binary counter configuration or the like is used.

What is claimed is:

1. An address counter comprising:
   a plurality of FIFO units each of which stores a corresponding bit of an address signal, each FIFO unit including a plurality of parallel connected latch circuits each having an input gate and an output gate;
   a first command counter that brings any one of the input gates included in each FIFO unit into ON state in response to a first internal command during a first operation mode, and that brings two or more input gates included in each FIFO unit into ON state in response to the first internal command during a second operation mode; and
   a second command counter that brings any one of the output gates included in each FIFO unit into ON state in response to one of second and third internal commands during the first operation mode, and that brings any one of the output gates included in each FIFO unit into ON state in response to the second internal command and brings any one of the output gates included in each FIFO unit into ON state in response to the third internal command during the second operation mode.

2. The address counter as claimed in claim 1, wherein the plurality of FIFO units are divided into at least first and second groups,
   the first command counter brings any one of the input gates included in each FIFO unit belonging to the first group and any one of the input gates included in each FIFO unit belonging to the second group into ON state in response to the first internal command during the second operation mode,
   the second command counter brings any one of the output gates included in each FIFO unit belonging to the first group into ON state in response to the second internal command during the second operation mode, and
   the second command counter brings any one of the output gates included in each FIFO unit belonging to the second group into ON state in response to the third internal command during the second operation mode.

3. The address counter as claimed in claim 1, wherein the FIFO units include 2m latch circuits, and
   each of the first and second command counters functions as one counter capable of counting 2m in the first operation mode, and functions as two counters each capable of counting m in the second mode.

4. The address counter as claimed in claim 1, wherein each of the first and second command counters has a ring counter configuration in which shift registers are connected in circulation.

5. The address counter as claimed in claim 1, wherein
the first internal command is generated in response to issuance of at least a read command or a write command,
the second internal command is generated after a lapse of a first latency relative to the first internal command, and
the third internal command is generated after a lapse of a second latency relative to the first internal command.

6. A semiconductor memory device, comprising:
a memory cell array;
a data input/output terminal;
a first data selection circuit that supplies a first data bus with write data inputted via the data input/output terminal;
a second data selection circuit that supplies the memory cell array with the write data on the first data bus; and
the address counter including:
a plurality of FIFO units each of which stores a corresponding bit of an address signal, each FIFO unit including a plurality of parallel connected latch circuits each having an input gate and an output gate;
a first command counter that brings any one of the input gates included in each FIFO unit into ON state in response to a first internal command during a first operation mode, and that brings two or more input gates included in each FIFO unit into ON state in response to the first internal command during a second operation mode; and
a second command counter that brings any one of the output gates included in each FIFO unit into ON state in response to one of second and third internal commands during the first operation mode, and that brings any one of the output gates included in each FIFO unit into ON state in response to the second internal command and brings any one of the output gates included in each FIFO unit into ON state in response to the third internal command during the second operation mode,
wherein the address signal that passes through the output gates is supplied to the first and second data selection circuits during the first operation mode,
the address signal that passes through the output gates in response to the second internal command is supplied to the first data selection circuit during the second operation mode, and
the address signal that passes through the output gates in response to the third internal command is supplied to the second data selection circuit during the second operation mode.

7. The semiconductor memory device as claimed in claim 6 further comprising a mode register for setting a burst length, wherein the first data selection circuit includes:
a FIFO block connected to the data input/output terminal;
a transfer circuit that inputs and outputs in parallel k-bit data continuously inputted or continuously outputted via the data input/output terminal; and
a second data bus that performs data transfer between the transfer circuit and the FIFO block, wherein
when a minimum burst length settable to the mode register is represented by j ($<k$), the transfer circuit performs data transfer using the second data bus in a j-bit unit irrespective of the burst length.

8. The semiconductor memory device as claimed in claim 7, wherein the memory cell array is divided into a plurality of groups, and
the semiconductor memory device further comprises main amplifiers each of which outputs the k-bit data from a corresponding group of the memory cell array, and wherein
the transfer circuit selects j-bit data for each group out of the k-bit data outputted from the main amplifiers and supplies the selected j-bit data via the second data bus to the FIFO block.

9. The semiconductor memory device as claimed in claim 8, wherein when the burst length set to the mode register is k, the transfer circuit successively supplies via the second data bus to the FIFO block the k-bit data read from the memory cell array belonging to a same group by each j bits.

10. The semiconductor memory device as claimed in claim 8, wherein when the burst length set to the mode register is j, the transfer circuit successively supplies via the second data bus to the FIFO block the j-bit data read from the memory cell array belonging to a different group.

11. A data processing system comprising a data processor and a semiconductor memory device coupled to the data processor, wherein the semiconductor memory device includes:
a memory cell array;
a data input/output terminal;
a first data selection circuit that supplies a first data bus with write data inputted via the data input/output terminal;
a second data selection circuit that supplies the memory cell array with the write data on the first data bus; and
the address counter including:
a plurality of FIFO units each of which stores a corresponding bit of an address signal, each FIFO unit including a plurality of parallel connected latch circuits each having an input gate and an output gate;
a first command counter that brings any one of the input gates included in each FIFO unit into ON state in response to a first internal command during a first operation mode, and that brings two or more input gates included in each FIFO unit into ON state in response to the first internal command during a second operation mode; and
a second command counter that brings any one of the output gates included in each FIFO unit into ON state in response to one of second and third internal commands during the first operation mode, and that brings any one of the output gates included in each FIFO unit into ON state in response to the second internal command and brings any one of the output gates included in each FIFO unit into ON state in response to the third internal command during the second operation mode,
wherein the address signal that passes through the output gates is supplied to the first and second data selection circuits during the first operation mode,
the address signal that passes through the output gates in response to the second internal command is supplied to the first data selection circuit during the second operation mode, and
the address signal that passes through the output gates in response to the third internal command is supplied to the second data selection circuit during the second operation mode.

* * * * *